United States Patent [19]

Tuszyski

[11] Patent Number: 4,646,002
[45] Date of Patent: Feb. 24, 1987

[54] CIRCUIT FOR HIGH IMPEDANCE BROAD BAND PROBE

[75] Inventor: Alfons A. Tuszyski, Burnsville, Minn.

[73] Assignee: Regents of the University of Minnesota, Minneapolis, Minn.

[21] Appl. No.: 608,782

[22] Filed: May 10, 1984

[51] Int. Cl.⁴ .......................................... G01R 31/02
[52] U.S. Cl. ............................ 324/72.5; 324/73 PC; 307/296 R; 330/156; 330/292
[58] Field of Search ............. 324/72.5, 73 PC, 123 R; 333/213, 214, 216; 330/156, 291, 292; 307/296 R, 318

[56] References Cited

U.S. PATENT DOCUMENTS

| | | | |
|---|---|---|---|
| 2,881,266 | 4/1959 | Miller | 330/68 |
| 3,099,000 | 7/1963 | Dunning | 340/248 |
| 3,283,242 | 11/1966 | Oliver | 324/57 |
| 3,300,718 | 1/1967 | Umphrey | 324/72.5 |
| 3,363,450 | 1/1968 | Simpkins et al. | 73/40.5 A |
| 3,371,273 | 2/1968 | Alford | 324/57 |
| 3,418,597 | 12/1968 | Smith | 331/65 |
| 3,452,743 | 7/1969 | Rieke | 128/734 |
| 3,543,154 | 11/1970 | Gordon | 324/102 |
| 3,646,579 | 2/1972 | Di Vita et al. | 324/72.5 |
| 3,710,082 | 1/1973 | Sloane et al. | 235/151 |
| 3,710,244 | 1/1973 | Rauchwerger | 324/61 R |
| 3,732,490 | 5/1973 | Botka | 324/57 R |
| 3,781,683 | 12/1973 | Freed | 324/73 R |
| 3,798,541 | 3/1974 | Campbell, Jr. et al. | 324/72.5 |
| 3,867,693 | 2/1975 | Saxenmeyer, Sr. | 324/73 R |
| 3,873,919 | 3/1975 | Vosteen | 324/72 |
| 3,879,644 | 4/1975 | Maltby | 324/61 P |
| 3,893,027 | 7/1975 | Veenendaal | 324/72.5 |
| 3,893,028 | 7/1975 | Febvre et al. | 324/72.5 |
| 3,993,951 | 1/1976 | Knanishu | 324/119 |
| 3,995,175 | 11/1976 | Hoyt et al. | 330/292 |
| 4,015,201 | 3/1977 | Chaffee | 324/51 |
| 4,016,492 | 4/1977 | Miller, Jr. et al. | 324/72.5 |
| 4,023,045 | 5/1977 | Migliardi et al. | 324/158 P |
| 4,038,599 | 7/1977 | Bove et al. | 324/73 R |
| 4,039,942 | 8/1977 | Glaser | 324/72 |
| 4,045,728 | 8/1977 | Fletcher et al. | 324/59 |
| 4,053,844 | 10/1977 | Hamaoui | 324/73 R |
| 4,057,823 | 11/1977 | Buckhardt et al. | 357/52 |
| 4,132,946 | 1/1979 | Holdren et al. | 324/72.5 |
| 4,145,651 | 3/1979 | Ripingill, Jr. | 324/72.5 |
| 4,152,639 | 5/1979 | Chaffee | 324/72.5 |
| 4,189,673 | 2/1980 | Shintaku | 324/72.5 |
| 4,195,259 | 3/1980 | Reid et al. | 324/72.5 |
| 4,201,939 | 5/1980 | Lee et al. | 324/72.5 |
| 4,204,114 | 5/1980 | Shoemaker et al. | 324/72.5 |
| 4,205,264 | 5/1980 | Gold | 324/72.5 |
| 4,209,742 | 6/1980 | Bender et al. | 324/72.5 |
| 4,214,201 | 7/1980 | Kern | 324/72.5 |
| 4,219,740 | 8/1980 | Little | 307/116 |
| 4,232,300 | 11/1980 | Wright et al. | 324/61 P |
| 4,492,932 | 1/1985 | Rusznyak | 330/156 |
| 4,498,058 | 2/1985 | Benrud | 330/292 |

OTHER PUBLICATIONS

G.G.B. Industries, Dec. 22, 1981, advertisement.
IEEE Journal of Solid-State Circuits, vol. SC-15, No. 2, pp. 177–183, Apr. 1980, "Function Testing of Bipolar IC's and LSI's with the Stroboscopic Scanning Electron Microscope".
IEEE Journal of Solid-State Circuits, vol. SC-9, No. 6, pp. 332–340 Dec. 1974, "A Fast-Settling Monolithic Operational Amplifier Using Doublet Compression Techniques".
IEEE Journal of Solid-State Circuits, vol. SC-12, No. 3, pp. 217–224, Jun. 1977, "A Low Input Capacitance Voltage Follower In a Compatible Silicon-Gate MOS-Bipolar Technology".

Primary Examiner—Stewart J. Levy
Assistant Examiner—Kevin D. O'Shea
Attorney, Agent, or Firm—Merchant, Gould, Smith, Edell, Welter & Schmidt

[57] ABSTRACT

A zero capacitance measurement probe to be used to make electrical measurements at a broad range of frequencies without having the probe itself affect the measured values. The probe reduces internal capacitances in the solid state active elements or creates a negative impedance to counteract capacitance external capacitance. Elimination of capacitance is accomplished by adjusting gains and current flow within active elements and by insulating the elements from ground by an additional substrate and metalized layer.

9 Claims, 6 Drawing Figures

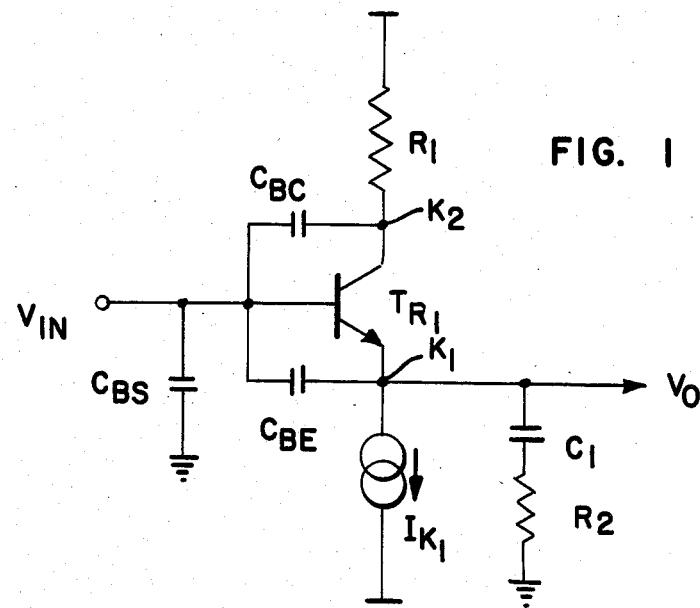
FIG. 1
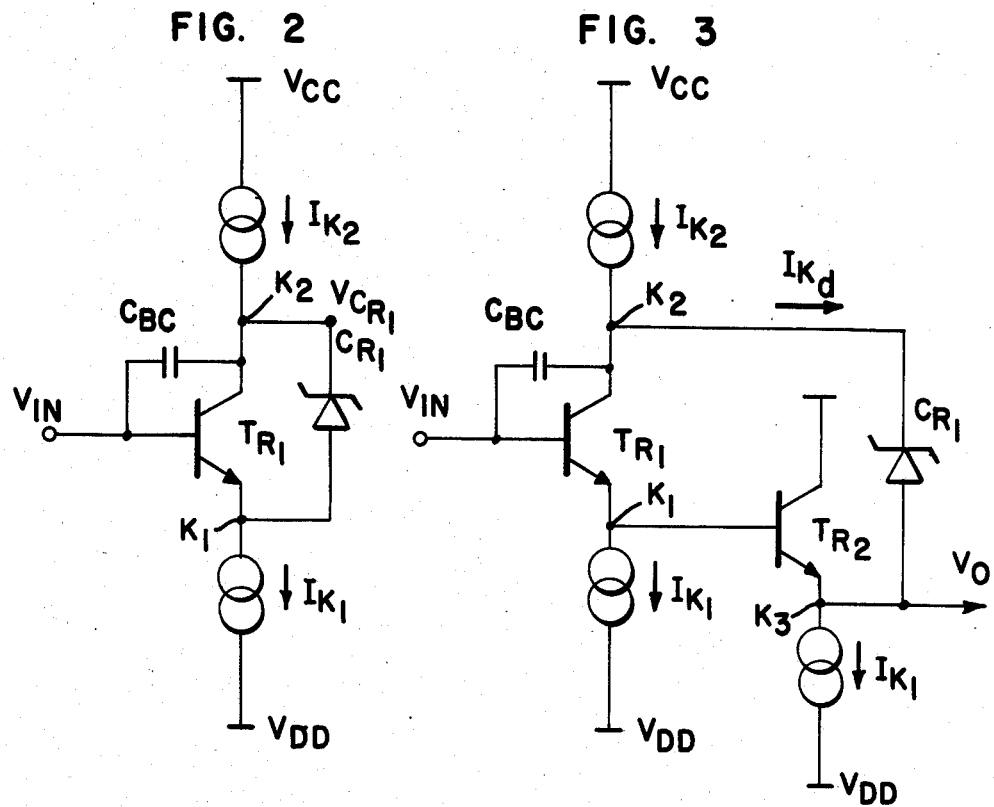
FIG. 2
FIG. 3

CIRCUIT FOR HIGH IMPEDANCE BROAD BAND PROBE

NOTICE OF POSSIBLE GOVERNMENT RIGHTS

This invention was made with Government Support under Grant No.: N00014-78-C-0741, awarded by the Department of the Navy. The Government has certain rights in this invention.

TECHNICAL FIELD

The present invention relates generally to the field of testing devices, more particularly, devices designed to test micro circuits or the like where the capacitance of the testing instrument is relevant since the instrument itself would significantly affect the test results.

BACKGROUND OF THE INVENTION

With the development of large-scale integrated circuits (LSI), there has been a serious problem in the testing of these circuits. Because the components are so small and so close together, the introduction of any test equipment into the circuit would so strongly interfere with the characteristics of the circuit, that the test could not be effectively performed. Specifically, a mechanical probe which would be applied to at a point within an integrated circuit might add so much capacitance or "load up" the circuits so substantially, that the measurement would be meaningless. Furthermore, since the circuits may operate up to 400 MHz, the problem of creating a high impedance probe becomes even more accute at these higher frequencies.

The only prior art method known to be effective in making LSI measurements involves a stroboscopic effect and requires extremely expensive equipment. It uses an electron beam to indirectly measure currents within the circuit.

The present invention overcomes the problem of probe interference without the significant cost and complexity of existing methods.

SUMMARY OF THE INVENTION

The present invention relates to a high impedance broad band probe and circuit therefore, which is used in making electrical measurements. The probe is characterized particularly by its low capacitance and, therefore, its lack of disturbance of the circuit upon which a test is being performed. Specifically, the circuit includes an active circuit element having a substrate and layers corresponding to emitter base and collector, and an inherent base-to-substrate capacitance and base-to-emitter capacitance. The base-to-emitter capacitance is reduced by adjusting the emitter gain of the active element to be close to but not less than one and a positive number.

According to another aspect of the invention, the base-to-collector capacitance is reduced by maintaining the collector and emitter voltage increments generally equal by providing a DC voltage source with low AC impedance between the collector and emitter.

According to further aspects of the invention, the base-to-substrate capacitance is reduced by supporting the substrate atop a second substrate layer having a metalized layer thereon so that the original substrate layer is elevated above ground.

According to further aspects of the invention, a positive feedback loop between input and output provides an AC current flow toward the input thereby creating a negative capacitance and cancelling the input capacitance.

Various advantages and features of novelty which characterize the invention are pointed out with particularity in the claims annexed hereto and forming a part hereof. However, for a better understanding of its use, reference should be had to the drawings which form a further part hereof, and to the accompanying descriptive matter in which there is illustrated and described preferred embodiments of the invention.

BRIEF DESCRIPTION OF THE DRAWINGS

In the drawings, specific embodiments of the invention are shown in good detail and explained in the detailed description of the drawings as follows:

FIG. 1 is a circuit schematic of a model capacitance circuit showing the effective location of input capacitances;

FIG. 2 is a circuit schematic showing a circuit for reducing base-to-collector capacitance;

FIG. 3 is a circuit schematic like FIG. 2 showing an alternate arrangement;

DETAILED DESCRIPTION OF THE INVENTION

Figure 4:
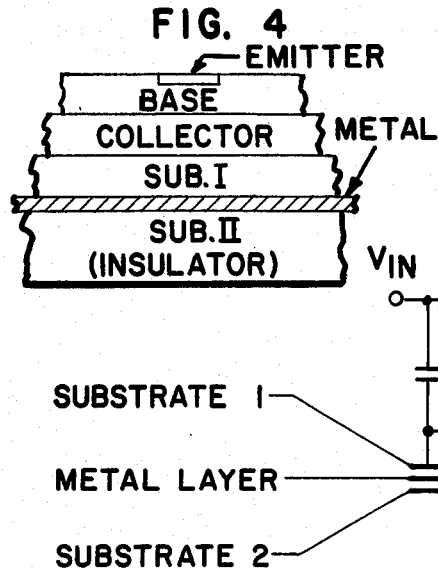
FIG. 4 is a schematic cross-sectional view of a solid state device according to the present invention.

The present invention is a device which allows direct measurement of a circuit at very high frequencies without adversely affecting the test results. Although the invention is called a "Zero Capacitance Probe", it could be characterized as a high impedance buffer circuit which places a high impedance between the test equipment (such as an oscilloscope) and the integrated circuit. With the buffer circuit in place, the oscilloscope does not influence the integrated circuit.

The problem with conventional circuitry is that capacitances result from the physical presence of the circuitry itself. We can model in where the capacitance in a circuit might exist by drawing representations of physical capacitors in those places. Looking at FIG. 1 of the drawings attached hereto, the input to a conventional transistor amplifier will have three main sources of capacitance. $C_{BS}$ (i.e., the base to substrate capacitance of the transistor), $C_{BC}$ (i.e., the base-to-collector capacitance) and $C_{BE}$ (i.e., the capacitance from base to emitter).

Capacitance creates a problem because it is a factor in the calculation of impedance ($Z = 1/(WC)$ where C is the capacitance and W is the radian frequency) so an increase in the capacitance or the frequency will result in a decrease in the impedance, which tends to load the circuit.

In cases involving an active element such as a transistor, the Miller effect must be considered. The Miller effect results in the capacitance from base to collector to be increased by a factor of one minus the gain of the transistor. Thus, the input capacitance of the circuit shown in FIG. 1 would be effectively:

$$C_{in} = C_{BS} + C_{BE} + C_{BC}(1-K)$$

As can be seen from the above equation, to reduce the input capacitance, it is necessary to reduce each of its three sources.

The present invention proposes a separate solution to reduce each capacitance.

The word "gain" is meant to mean a ratio of an output measurement over an input measurement. The output point can be either emitter or collector or equivalent.

REDUCING $C_{BE}$

Reducing the capacitance from the base emitter is dependent upon the gain of the transistor. If gain (K) is less than but very close to 1, then $(1-K_1)$ will be an extremely small number thereby reducing $C_{BE}$.

The circuit in FIG. 1 is an emitter follower which has a gain K as measured at the emitter as being approximately less than or equal to 1, but a positive number.

REDUCING $C_{BC}$

The base-to-collector capacitance problem is not as easily resolved. Again, due to the Miller effect, the capacitance $C_{BC}=(1-K_2)\cdot(C_{BC})$. In this case, $K_2$ is the gain measured at the collector. Typically, the gain at the collector is a negative number less than minus 1, which would result in a very substantial increase in capacitance by the Miller effect. The present invention solves the problem by tying the gain $K_1$ very close to $K_2$.

Turning to FIG. 2, resistor R1 is replaced with a current source $I_{K2}$ to provide a fixed current through the collector of the transistor. In order to prevent the gain $K_2$ from being substantially different from $K_1$, we can tie the collector and emitter together by placing a battery across the terminals. A battery or zener diode shifts the voltage and provides a high resistance for purposes of direct current but a very low impedance to AC. Voltage at the point marked $K_1$ is thus $(V_{in}\cdot K_1)$. The voltage at $K_2$ then will be:

$$V_{in}\cdot K_1 + V_{CR1}$$

and the AC voltage at $K_2$ will be:

$$V_{in}\cdot K_1$$

Instead of using a battery, a zener diode provides the same conditions. Thus, the voltage across the capacitor $C_{BC}$ is the difference of $V_{in}-(V_{in}\cdot K_1)$ (ignoring the battery or diode which is insignificant). Thus, the voltage across $C_{BE}=(1-K_1)\cdot V_{in}$. Assuming that the incremental (or AC) currents $I_{K2}$ and $I_{K1}$ are approximately equal, the capacitance $C_{BC}$ effectively becomes equal to:

$$(1-K_1)\cdot C_{BC}$$

One could by the way also speak of incremental voltage instead of current, which translates to incremental current by determining the voltage across the capacitance divided by the product of the capacitance and frequency.

As mentioned above, $K_1$ is already a number less than but very close to 1, (say, 0.999). Thus, $C_{BC}$ will also be reduced substantially.

In reality, currents $I_{K1}$ and $I_{K2}$ as shown in FIG. 2 are not equal. Thus, it is necessary to provide a means for reconciliation of this current flow.

FIG. 3 shows such a circuit. $I_{K2}$ here is meant to be substantially larger than $I_{K1}$. By providing an additional transistor TR2, a shunt path is provided as a current $I_{Kd}$ (the differential current) flows through zener diode CR1, thus balancing the equation. This solves the problem of the unequal current flows or potential inequality and makes the solution to $C_{BC}$ practical.

REDUCING $C_{BS}$

Figure 5:
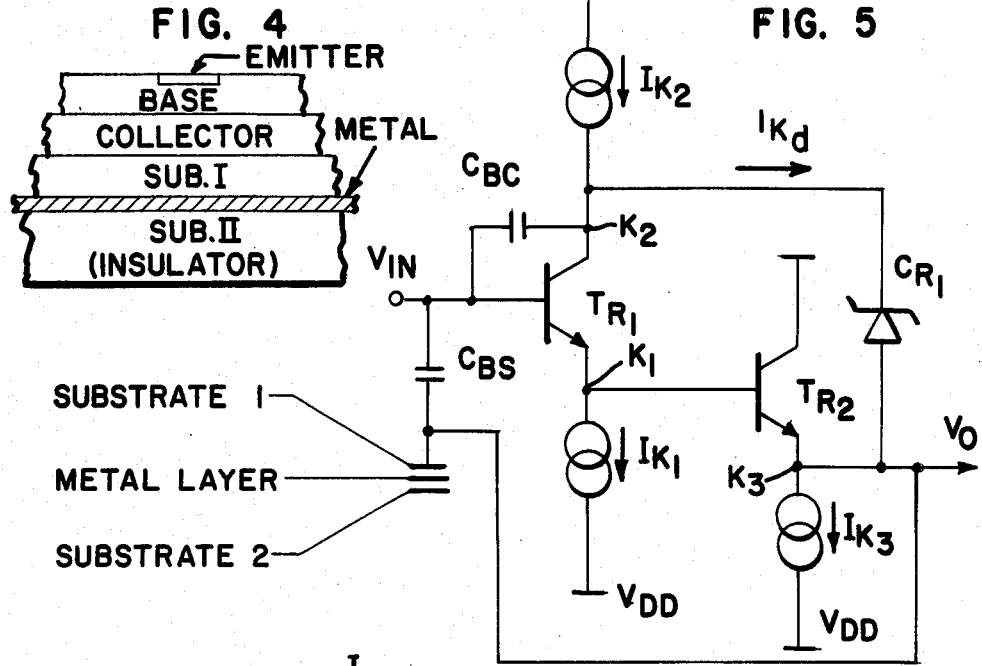
FIG. 5 is a circuit schematic employing the solid state device in FIG. 4.

The solution to the base to substrate capacitance ($C_{BS}$) problem is different from the above solutions. Eliminating the emitter and collector capacitances involved circuitry whereas the base capacitance is removed by a mechanical solution. FIG. 4 shows a cross sectional view of a multilayered signal amplifying device in the form of an integrated circuit modified as per this invention. The structure shows a base layer atop a collector layer which itself is on a substrate. So far, this is a standard procedure. The present invention inserts a metalized layer under the first substrate and sets that atop a second insulating substrate which is an insulator (see FIG. 4). By elevating the first substrate above ground, $C_{BS}$ is effectively reduced by the formula $C_{BS}(1-(K_3\cdot K_2))$, where $K_2$ and $K_3$ are the gains of the transistors $TR_1$ and $TR_2$ which are operated as voltage followers. Their product will be slightly less than 1, perhaps as high as 0.99, yielding a deficiency factor $(1-K_1\cdot K_2)$ of 0.01, thereby reducing $C_{BS}$ by a factor of 100. The circuit in this configuration is represented in FIG. 5.

NEGATIVE IMPEDANCE

Figure 6:
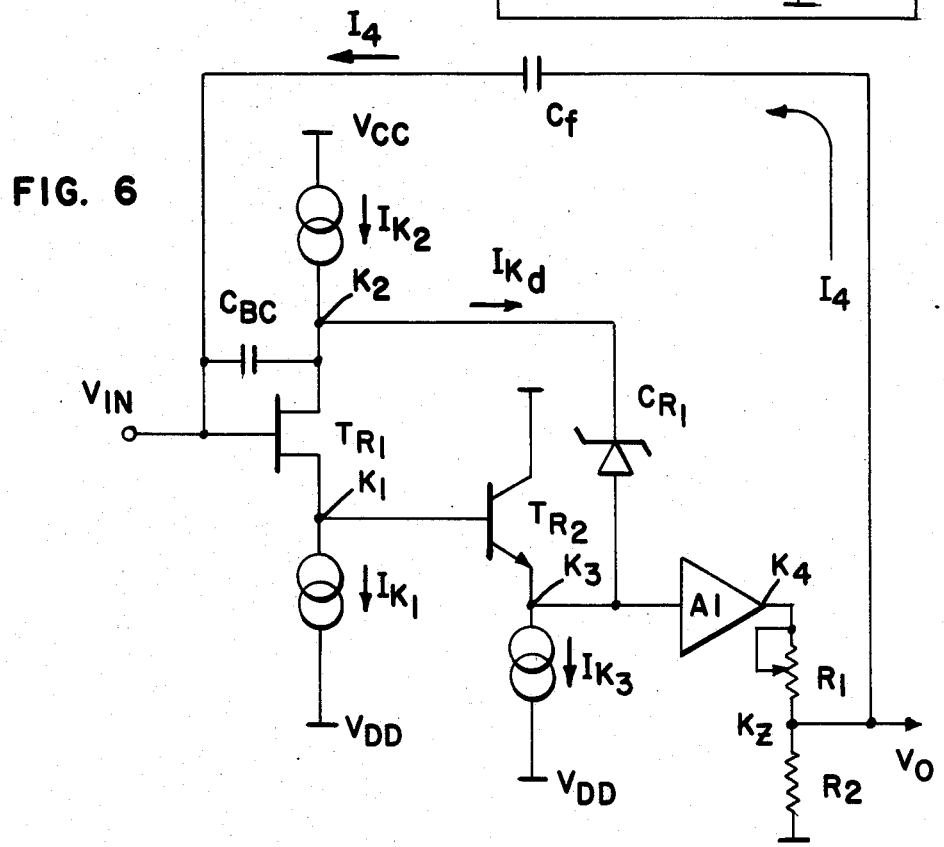
FIG. 6 is a circuit schematic showing a negative impedance circuit.

As an alternate or perhaps an additional solution to the problem, it is possible to provide a so-called "negative impedance" $Z_f$ which has a negative capacitance $C_f$ (i.e. a capacitance with a negative or reverse current flow) which will effectively cancel other capacitances in the circuit. The circuit shown in FIG. 6 provides such a solution. In this case, an additional operational amplifier A1 is provided having a gain of $K_4$.

Resistors $R_1$ and $R_2$ are provided at the output of the amplifier to permit adjustment of the gain $K_4$ to a value between 1 and 2. Looking at the current through $C_f$, $I_4$, it will be equal to:

$$V_{in}/Z_f(1-K_z) \text{ where } K_z=(K_4\cdot K_3\cdot K_1)R_1/(R_1+R_2)$$

and this is achieved by adjustment of the potentiometer $R_1$. If $K_z$ is greater than 1, then $I_4$ (the current through $C_f$) will be flowing toward the input (as shown in FIG. 6) making the impedance less than zero, i.e., negative impedance. This will provide means to cancel completely input currents into $C_{BS}$, $C_{BC}$ and $C_{BE}$.

Numerous characteristics and advantages of the invention have been set forth in the foregoing description together with the details and structure and function of the invention, and the novel features thereof are pointed out in the appended claims. The disclosure, however, is illustrative only, and changes may be made in detail, such as substitution of active circuit elements with existing or other devices developed in the future which are employed within the principle of the invention to the full extent indicated by the broad general meaning of the terms expressed in the appended claims.

I claim:

1. A high impedance broadband probe for use in making electrical measurements comprising an active circuit element having a substrate and layers corresponding to an emitter, base and collector and with a base-to-substrate capacitance $C_{BS}$ and with a base-to-emitter capacitance $C_{BE}$, the improvement comprising means for reducing $C_{BE}$ by providing a circuit having gain ($K_1$) at the emitter of the active element to be very close to but less than one and a positive number, and means for reducing base-to-collector capacitance ($C_{BC}$) having means for maintaining the gain of the collector ($K_2$) to be generally equally to gain ($K_1$) and means for providing a DC voltage source with low AC impedance between the collector and emitter which maintains the emitter and collector gains generally equal thereby reducing the $C_{BC}$.

2. A probe according to claim 1 wherein said DC voltage source includes an element which draws a differential current from the collector such that the collector and emitter currents will be maintained equal.

3. A probe according to claim 2 including means for reducing base-to-substrate capacitance including supporting said substrate atop a second substrate layering having a metalized layer thereon so that the two substrate layers are separated by the metal layer, thereby elevating the first substrate above ground potential.

4. A probe according to claim 3 including means for providing a positive feedback loop from the output to the input to reduce the input capacitance of the probe and including means to adjust the gain of the active elements in the probe to provide feedback current flow toward the input thereby cancelling input capacitance.

5. A high impedance broadband probe for use in making electrical measurements, comprising:

a transistor having a substrate layer and base, emitter and collector and a collector gain to only slightly less than one, thereby reducing base-to-emitter capacitance, a gain at the collector generally equal to the gain at the emitter, thereby reducing the base-to-collector capacitance; and a metalized layer on the bottom of the substrate and a second substrate layer abutting the remaining surface of the metalized layer, thereby elevating the first substrate layer above ground potential and reducing the base capacitance of the transistor.

6. A multi-stage high impedance broadband buffer circuit for use in making electrical measurement without affecting the circuitry to be measured comprising an input and output and a capacitor connected therebetween and wherein the gain of the circuit is greater than one providing a positive feedback current flow through the capacitor, said flow thereby generating a negative input impedance to cancel the effects of input capacitances inherent in the buffer circuit.

7. A high impedance broadband buffer circuit for use in making electrical measurements comprising a multi-stage amplifier, each stage having a predetermined gain and including a capacitor $C_f$ between the input and output of the circuit, the output being adjustable by a voltage divider network, and the input having an input voltage $V_{in}$, and wherein a current I is caused to flow toward the input from the output when the overall gain $K_z$ is greater than 1 as calculated according to:

$$I_4 = (V_{in}/Z)(1 - K_z)$$

where $K_z$ is the overall gain input-output and where $Z_f = [1/(W \cdot C)]$ (W = frequency).

8. A method of reducing input capacitance of a probe circuit employing an active transistor element having a base emitter and collector by the steps of adjusting the collector gain to approach but not equal unity to reduce base-to-emitter capacitance, and adjusting the collector current to be generally equal to the emitter current thereby reducing the base-to-collector capacitance.

9. A multi-layered solid state signal amplifying device having first and second layers with a third gating layer sandwiched therebetween, the second layer atop a first substrate, the improvement comprising means to reduce capacitance at the gating layer including a metalized layer affixed to a second substrate on one surface and affixed to the bottom of said first substrate on the other surface thereof, so that the device is electrically elevated from ground potential by said second substrate and metalized layer.

* * * * *

UNITED STATES PATENT AND TRADEMARK OFFICE
CERTIFICATE OF CORRECTION

PATENT NO. : 4,646,002

DATED : February 24, 1987

INVENTOR(S) : Alfons A. Tuszynski

It is certified that error appears in the above-identified patent and that said Letters Patent is hereby corrected as shown below:

ON THE TITLE PAGE:
   Inventor's name is misspelled - "Tuszyski" should be
     --Tuszynski--

Column 1, line 32, "accute" should be --acute--

Column 1, line 44, "therefore" should be --therefor--;

Column 4, line 56, first "and" should be --of--

Signed and Sealed this

Twenty-second Day of December, 1987

Attest:

DONALD J. QUIGG

*Attesting Officer*     *Commissioner of Patents and Trademarks*